(12) United States Patent
Liao

(10) Patent No.: US 6,180,477 B1
(45) Date of Patent: Jan. 30, 2001

(54) METHOD OF FABRICATING FIELD EFFECT TRANSISTOR WITH SILICIDE SIDEWALL SPACERS

(75) Inventor: Kuan-Yang Liao, Taipei (TW)

(73) Assignee: United Silicon Incorporated, Hsinchu (TW)

( * ) Notice: Under 35 U.S.C. 154(b), the term of this patent shall be extended for 0 days.

(21) Appl. No.: 09/293,421

(22) Filed: Apr. 16, 1999

(30) Foreign Application Priority Data

Mar. 2, 1999 (TW) .................................................. 88103136

(51) Int. Cl.[7] .......................... H01L 21/336; H01L 21/28; H01L 21/44; H01L 21/3205; H01L 21/4763
(52) U.S. Cl. .......................... 438/305; 438/581; 438/585
(58) Field of Search .................................. 438/304, 305, 438/581, 585, 595, 649, 682, 683

(56) References Cited

U.S. PATENT DOCUMENTS

| 5,102,815 | * | 4/1992 | Sanchez | 437/44 |
| 5,256,585 | * | 10/1993 | Bae | 437/44 |
| 5,424,572 | * | 6/1995 | Solheim | 257/370 |
| 5,451,532 | * | 9/1995 | Bashir et al. | 437/31 |
| 5,581,114 | * | 12/1996 | Bashir et al. | 257/588 |
| 5,679,589 | * | 10/1997 | Lee et al. | 437/40 GS |
| 5,972,763 | * | 10/1999 | Chou et al. | 438/305 |

* cited by examiner

Primary Examiner—John F. Niebling
Assistant Examiner—Walter L. Lindsay, Jr.
(74) Attorney, Agent, or Firm—Jiawei Huang; J.C. Patents

(57) ABSTRACT

A method of fabricating a field effect transistor is described. A gate oxide layer is formed on a substrate. A gate is formed on the gate oxide layer. A source region and a drain region are formed beside the gate in the substrate. A first spacer is formed beside a sidewall of the gate. A preserve layer is formed beside the first spacer. A second spacer is formed beside a sidewall of the preserve layer.

10 Claims, 3 Drawing Sheets

METHOD OF FABRICATING FIELD EFFECT TRANSISTOR WITH SILICIDE SIDEWALL SPACERS

CROSS-REFERENCE TO RELATED APPLICATION

This application claims the priority benefit of Taiwan application serial no. 88103136, filed Mar. 2, 1999, the full disclosure of which is incorporated herein by reference.

BACKGROUND OF THE INVENTION

1. Field of the Invention

The present invention relates to a semiconductor fabricating method. More particularly, the present invention relates to a method of fabricating a field effect transistor (FET).

2. Description of the Related Art

A field effect transistor (FET) is an important device in Very Large Scale Integration (VLSI) and Ultra Large Scale Integration (ULSI) fabrication process. The FET comprises a gate oxide layer formed on a substrate, a gate formed on the gate oxide layer, a spacer beside the gate on the gate oxide layer, and a source/drain region beside the gate in the substrate. When the FET is operated, an electrical field is generated by applying a voltage to the gate. The electrical field is used to control a channel, which is between the source region and the drain region. For example, if channel is turned on, the electrons flow from the source region to the drain region. In contrast, if the channel is turned off, the electrons cannot flow between the source region and the drain region. Therefore, the on or off state of the channel controls the connection or disconnection of the electrical circuit.

Because the integration of semiconductor devices increases, there is a corresponding size reduction in the FET. However, size reduction causes problems, arising from a gate fringing electric field, to occur. When the FET is operated, the voltage is applied to the gate. A potential difference between the gate and fringing devices occurs. Thus, an electrical field, which is specifically called a fringing electrical field, is generated. Typically, the spacer provides isolation to reduce the fringing electrical field effect on the fringing devices near the FET. However, as the size of device decreases, the gate fringing electrical field effect becomes especially obvious. Even when the gate is operated with a low voltage, the gate fringing electrical field still greatly affects the FET.

The gate fringing electrical field effect enhances the FET to attract a portion of the electrons, which portion is supposed to flow from the source region to the drain region, into the gate. This phenomenon of electrons move from drain side to gate is called a hot electron effect. The hot electron effect leads to threshold voltage drift and results in a device performance degradation. The lifetime of device and circuit is therefore decreased.

FIG. 1 is a schematic, cross-sectional view showing a conventional FET and the fringing electric field.

In FIG. 1, a patterned gate oxide layer 110 is formed on a substrate 100. A gate 106 is formed on a portion of the gate oxide layer 110. A spacer 108 is formed beside the gate 106 on the gate oxide layer 110. A source region 102 and a drain region 104 are formed beside the gate 106 in the substrate 100. A silicide layer 112 is formed on the source region 102 and the drain region 104, so as to connect other circuits (not shown).

While the FET is operated, a voltage is applied to the gate 106. The electrical potential of the gate 106 is higher than that of the silicide layer 112 on the source region 102 and the drain region 104. This, in turn, causes a gate fringing electric field 114 to occur. Once the spacer 108 cannot effectively isolate the gate fringing electric field 114, a portion of the electrons is attracted to the gate 106 and leads to a hot electron effect.

SUMMARY OF THE INVENTION

The invention provides a method of fabricating a field effect transistor. A gate oxide layer is formed on a substrate. A gate is formed on the gate oxide layer. A first spacer is formed beside a sidewall of the gate. A source region and a drain region are formed beside the first spacer in the substrate. A preserve layer is formed over the substrate. A polysilicon layer is formed to cover the preserve layer. A portion of the polysilicon layer is removed to form a polysilicon spacer. A portion of the preserve layer exposed by the polysilicon spacer is removed. A metallic layer is formed on the source region, the drain region, the gate, the first spacer, the preserve layer, and the polysilicon spacer. A thermal step is performed. The metallic layer reacts with the polysilicon spacer to form a second spacer. A self-aligned silicide layer is formed on the source region, the drain region, and the gate. The remaining metallic layer is removed.

In the invention, the material of the second spacer is silicide. Since the second spacer and the gate are both conductive materials, the gate fringing electric field is preserved between the gate and the second spacer. Thus, the gate fringing electric field does not interfere with the source region and the gate region. The hot electron effect and the breakdown effect of FET do not occur.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
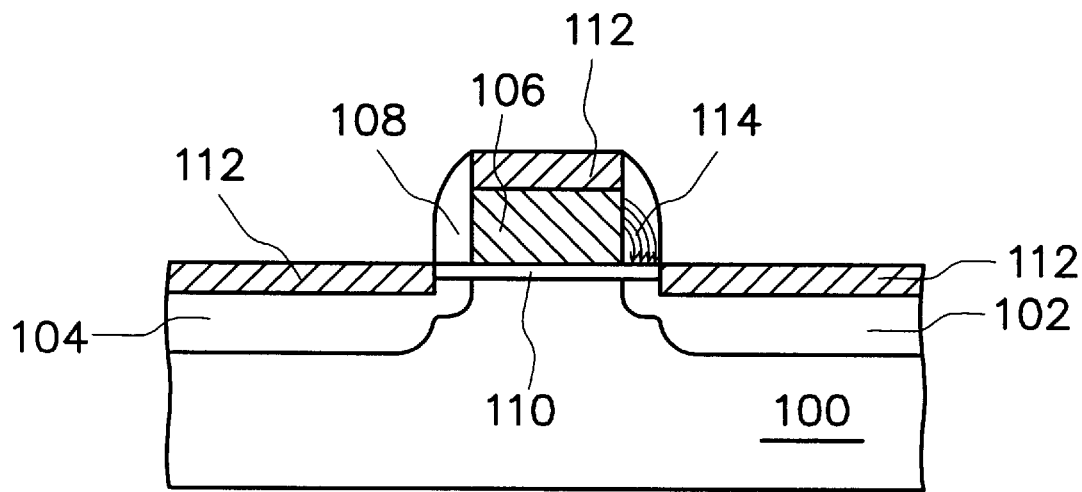
FIG. 1 is a schematic, cross-sectional view showing a conventional field effect transistor (FET) and the fringing electric field.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
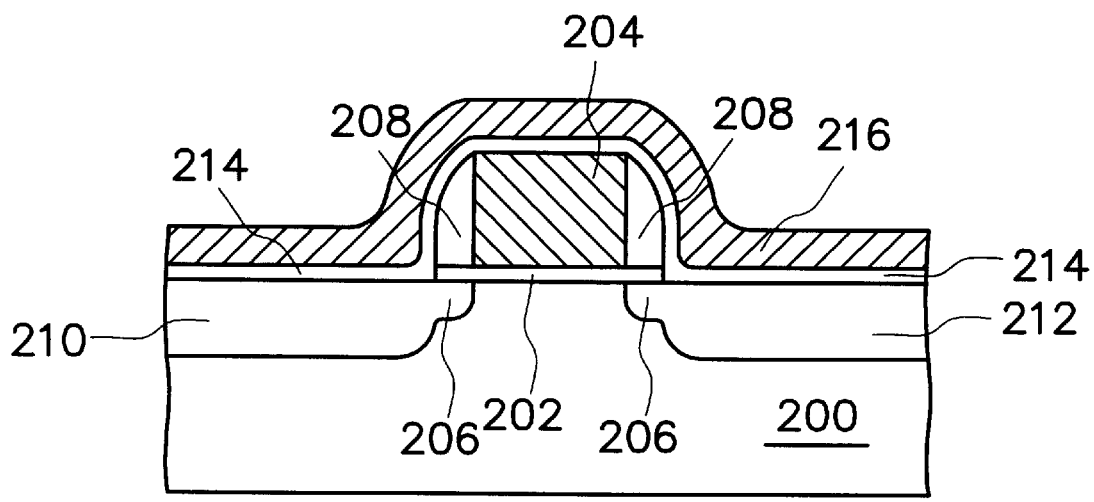
FIGS. 2A through 2D are schematic, cross-sectional views showing a method of fabricating an FET according to one preferred embodiment of the invention.

In FIG. 2A, a gate oxide layer 202 is formed on a substrate 200. A gate 204 is formed on the gate oxide layer 202. A lightly doped drain region 206 is formed beside the gate 204 in the substrate 200 by, for example, ion implantation. The materiel of the gate 204 comprises polysilicon. The gate 204 preferably has a thickness of about 2000 angstroms, but not limited to this thickness. A first spacer 208 is formed beside the sidewall of the gate 204. A source region 210 and a drain region 212 are formed beside the spacer 218 in the substrate 200. The source region 210 and the drain region 212 are formed by, for example, ion implantation. The material of the first spacer 208 comprises silicon oxide or silicon nitride. A preserve layer 214 and a polysilicon layer 216 are formed in sequence over the substrate 200. The material of the preserve layer 214 comprises silicon oxide or silicon nitride. The preferred thickness of the preserve layer 214 is about 100 angstroms to 300 angstroms. The preferred thickness of the polysilicon layer 216 is about 100 angstroms to 500 angstroms.

Figure 2B:
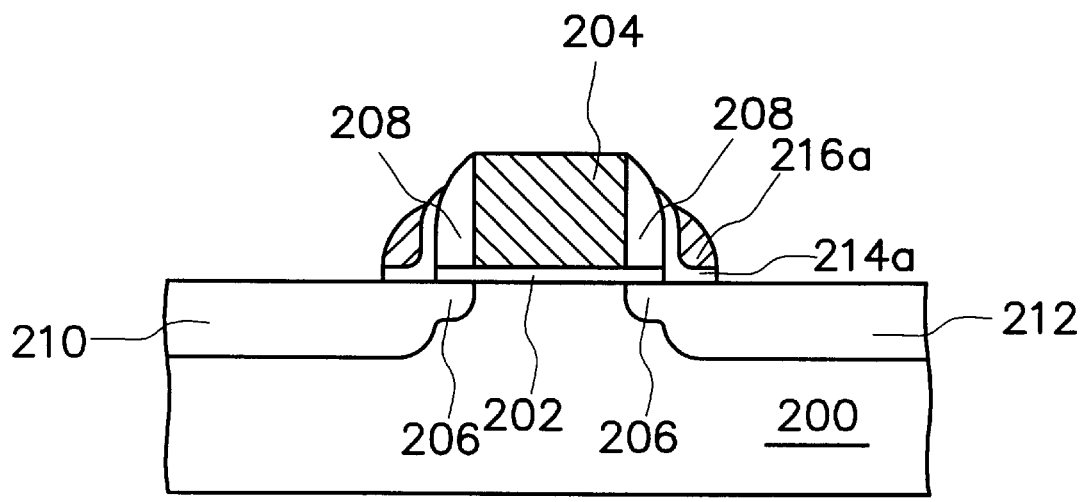

In FIG. 2B, a portion of the polysilicon layer 216 is removed to form a polysilicon spacer 216a beside the sidewall of the preserve layer 214 by, for example, anisotropic etching. The preserve layer 214 protects the substrate 200 from being etched during the step of removing a portion of the polysilicon layer 216. A portion of the preserve layer 214 exposed by the polysilicon layer 216a is then removed to form a preserve layer 214a.

Figure 2C:
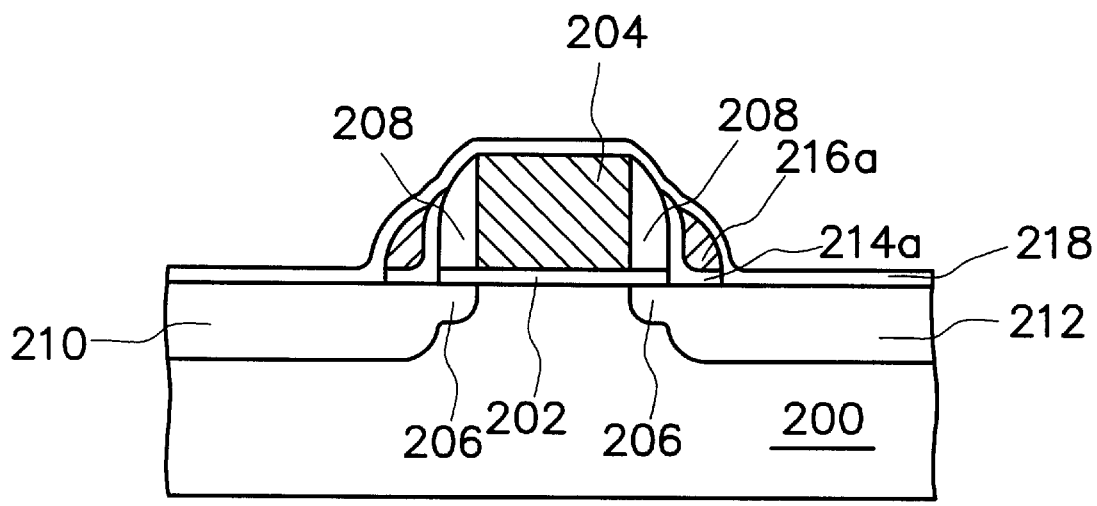

In FIG. 2C, a metallic layer 218 is formed over the substrate 200 to cover the source region 210, the drain region 212, the gate 204, the first spacer 208, the preserve layer 214a, and the polysilicon spacer 216a. The material of the metallic layer 218 can be titanium or cobalt, for example.

Figure 2D:
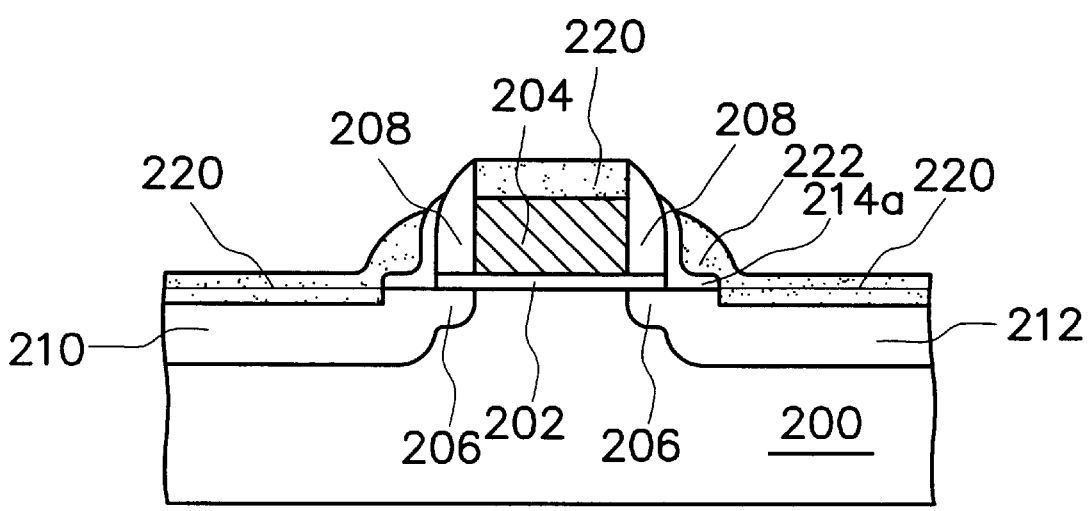

In FIG. 2D, a thermal step is performed. The metallic layer 218 on the source region 210, the drain region 212, and the gate 204 reacts with silicon material to form a self-aligned silicide layer 220, which is used to connect other circuits (not shown). Meanwhile, the metallic layer 218 reacts with the polysilicon spacer 216a to form a second spacer 222, which is a silicide layer, on the sidewall of the preserve layer 214a. The remaining metallic layer 218 is removed after reaction.

The present invention forms a preserve layer and a second spacer in sequence beside the first spacer. Since the second spacer and the gate are both conductive materials, the gate fringing electric field is retained between the gate and the second spacer. Thus, the gate fringing electric field does not interfere with the source region and the gate region. The hot electron effect can be reduced.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a field effect transistor, comprising steps of:

forming a gate oxide layer on a substrate;

forming a gate on the gate oxide layer;

forming a first spacer beside a sidewall of the gate;

forming a source region and a drain region beside the first spacer in the substrate;

forming a preserve layer over the substrate;

forming a polysilicon layer to cover the preserve layer;

removing a portion of the polysilicon layer to form a polysilicon spacer on a sidewall of the preserve layer;

removing a portion of the preserve layer exposed by the polysilicon spacer;

forming a metallic layer on the source region, the drain region, the gate, the first spacer, the preserve layer, and the polysilicon spacer;

performing a thermal step, wherein the metallic layer reacts with the polysilicon spacer to form a second spacer on the sidewall of the preserve layer and to form a self-aligned silicide layer on the source region, the drain region, and the gate; and removing the remaining metallic layer.

2. The method of claim 1, wherein the second spacer comprises silicide.

3. The method of claim 1, further comprising forming a lightly doped drain region beside the gate in the substrate.

4. The method of claim 3, wherein the lightly doped drain region is formed by ion implantation.

5. The method of claim 1, wherein the step of removing a portion of the polysilicon layer comprises anisotropic etching.

6. A method of fabricating a field effect transistor, comprising the steps of:

providing a substrate comprising a gate oxide layer formed on the substrate, a gate formed on the gate oxide layer, a source region and a drain region beside the gate in the substrate, and a first spacer beside a sidewall of the gate;

forming a preserve layer covering at least a portion of the first spacer; and forming a self-aligned silicide second spacer covering at least a portion of a sidewall of the preserve layer.

7. The method of claim 6, wherein the step of forming the preserve layer comprises:

forming a preserve layer on the substrate; and removing a portion of the preserve layer.

8. The method of claim 6, wherein the step of forming the second spacer comprises:

forming a polysilicon spacer beside the preserve layer;

forming a metallic layer to cover the source region, the drain region, the gate, the first spacer, the gate oxide layer, and the polysilicon spacer;

performing a thermal step, wherein the metallic layer reacts with the polysilicon spacer to convert into the second spacer, and a self-aligned silicide layer is formed on the source region, the drain region, and the gate; and removing the remaining metallic layer.

9. The method of claim 8, wherein the metallic layer comprises titanium.

10. The method of claim 8, wherein the metallic layer comprises cobalt.

* * * * *